US007016255B2

United States Patent
Lee et al.

(10) Patent No.: US 7,016,255 B2
(45) Date of Patent: Mar. 21, 2006

(54) MULTI-PORT MEMORY DEVICE

(75) Inventors: Ihl-Ho Lee, Ichon-shi (KR);
Kyung-Whan Kim, Ichon-shi (KR);
Jae-Jin Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 38 days.

(21) Appl. No.: 10/876,231

(22) Filed: Jun. 23, 2004

(65) Prior Publication Data

US 2005/0249018 A1  Nov. 10, 2005

(30) Foreign Application Priority Data

May 6, 2004  (KR) ................... 10-2004-0031969

(51) Int. Cl.
*G11C 7/00* (2006.01)

(52) U.S. Cl. ................... 365/230.05; 365/230.03
(58) Field of Classification Search .......... 365/230.03, 365/230.05, 200, 201
See application file for complete search history.

(56) References Cited

U.S. PATENT DOCUMENTS

| 5,319,603 A | * | 6/1994 | Watanabe et al. | ...... 365/230.05 |
| 5,450,355 A | * | 9/1995 | Hush | ...................... 365/189.04 |
| 5,726,948 A | * | 3/1998 | Hush et al. | ............ 365/230.05 |

* cited by examiner

*Primary Examiner*—Vu A. Le
(74) *Attorney, Agent, or Firm*—Blakely Sokoloff Taylor & Zafman

(57) ABSTRACT

A multi-port memory device can avoid failure of the first high data during initial operation so that reliability and operation characteristic of the memory device can be improved. The multi-port memory device comprises a global data bus having a multiplicity of bus lines, a plurality of banks having a current sensing type transceiving structure for exchanging data with the global data bus, one or more ports having a current sensing type transceiving structure for exchanging data with the global data bus, a plurality of switches, each arranged between the corresponding bank and the bus lines of the global data bus for selectively connecting one of a redundant column and normal columns of the corresponding bank to the global data bus, and a controlling unit for restricting the turn-on period of the switches to the substantial operation period of the corresponding bank.

8 Claims, 17 Drawing Sheets

MULTI-PORT MEMORY DEVICE

FIELD OF THE INVENTION

The present invention relates to a semiconductor memory design technique; and, more particularly, to an initial voltage improving technique for a global data bus in a multi-port memory device.

BACKGROUND OF THE INVENTION

Most of memory devices such as RAM include one port which has a number of input/output pin sets. That is, they include only one port for exchanging data with a chip set. However, in these days, functional separation between the chip set and the memory becomes ambiguous and integration of the chip set and the memory is considered. From this, a multi-port memory device is requested for directly exchanging data with a peripheral graphic device, a CPU and so on. However, in order to implement such a multi-port memory device, all the memory cells can be accessed from any one of a number of ports.

Inventors of the present invention have suggested architecture of a 256M multi-port memory device in Korean Patent Application no. 2003-92375 filed on Dec. 17, 2003.

FIG. 1 provides a diagram of architecture of a 256M multi-port DRAM according to Korean Patent Application no. 2003-92375.

Referring to FIG. 1, the suggested 256M multi-port DRAM comprises a number of banks bank0–bank15, each bank having a number memory cells and a row decoder RDEC, arranged in row direction (horizontally in FIG. 1) in groups in four quarter planes of a core region, respectively, an arbitrator 100 arranged between the part of the first and the third quarter planes and the part of the second and the fourth quarter planes to divide the core region into two parts for arbitrating the operation of each element in the memory device by generating an inner command signal, an inner address signal and a control signal by using an inputted command, an inputted address and so on, a number of ports port0–port7 arranged in the boundary region of respective quarter planes for performing independent communication with other target devices, a first to a fourth global data buses GIO_LU, GIO_RU, GIO_LD, GIO_RD arranged between the respective banks and the corresponding ports in each quarter plane in row direction for transferring parallel data transmission, a first and a second global data bus connecting units PR_U, PR_D, each arranged between two global data buses that are adjacent to each other in row direction, for selectively connecting the two global data bus, a number of transfer buses TB arranged in column direction of the respective banks (vertically in FIG. 1) for performing data transmission within the banks, a number of transfer bus connecting units TG, each arranged between the two banks that are adjacent in column direction for selectively connecting the transfer buses TB of the two banks, a number of bus connecting units TL arranged between the respective banks and the global data buses in the corresponding quarter planes of the banks for performing data exchange between the respective transfer buses TB and the corresponding global data buses, and a number of data transferring units QTRX arranged between the respective ports and the global data buses in the corresponding quarter planes of the ports for performing data transmission between the respective ports and the corresponding global data buses.

It will be described for detailed construction of the 256M multi-port DRAM.

Each of 16 banks bank0–bank15 has 16M (8 k rows×2 k columns) DRAM cells and a row decoder RDEC. There are included a bit line sense amplifier and an equalizer in each bank, which are essential parts in a typical DRAM core region. The banks bank0–bank15 are arranged in row direction in groups of 4 in the respective quarter planes of the core region. In particular, the banks bank0, bank2, bank4, bank6 are arranged in the first quarter plane (the upper left part), the banks bank8, bank10, bank12, bank14 are arranged in the second quarter plane (the upper right part), the banks bank1, bank3, bank5, bank7 are arranged in the third quarter plane (the lower left part), and the banks bank9, bank11, bank13, bank15 are arranged in the fourth quarter plane (the lower right part). On the other hand, each of the row decoders RDEC are desirably arranged on one side of the corresponding bank, paired with another row decoder RDEC for the adjacent bank. One page (column) is formed with four segments (each segment including 512 cells).

The arbitrating unit 100 generates inner command signals such as an inner activation command signal ACT, an inner deactivation command signal PCG, an inner read command signal RD and an inner write command signal WD, inner address signals such as an activation array address AAA, a deactivation array address PAA, a read array address RAA, a write array address WAA, a row address RA, a read segment address RSA and a write segment address WSA, and control signals such as a transfer gate control signal TGC, a port/pipe register flag signal PHFG, a port/pipe register data driving signal DP and a DRAM core test mode flag signal DTM, by using a command and an address that are transferred as packets, to arbitrate the operation of the elements of the memory device.

The ports port0–port7 are arranged in boundary of dies of the respective quarter planes (the vertical side of each quarter plane shared by all the corresponding banks) in groups of 2. Particularly, the ports port0, port2 are arranged in the first quarter plane, the ports port4, port6 are arranged in the second quarter plane, the ports port1, port3 are arranged in the third quarter plane, and the ports port5, port7 are arranged in the fourth quarter plane. Each port supports serial I/O interface and performs independent communication with a corresponding target device. On the other hand, when the ports port0–port7 supports the serial I/O interface, each of the ports port0–port7 includes a number of pads corresponding to data, an address and a command, pad buffers (a read buffer, a write buffer) for buffering transmit/receive signals that are transferred to the pads, a decoder for decoding the received data, an encoder for encoding the signal to be transmitted, and a data converter for converting the parallel data to be transmitted to serial data.

Further, the first global data bus GIO_LU is arranged between the banks and the ports in the first quarter plane, the second global data bus GIO_RU is arranged in the second quarter plane, the third global data bus GIO_LD is arranged in the third quarter plane, and the fourth global data bus GIO_RD is arranged in the fourth quarter plane. Each of the first to the fourth global data buses GIO_LU, GIO_RU, GIO_LD, GIO_RD is a bi-directional data bus, e.g., a 512-bit bus, connected to the banks, the ports and the global data bus connecting units PR_U, PR_D in the corresponding quarter plane.

On the other hand, the first global data bus GIO_LU and the second global data bus GIO_RU can be connected through the first global data bus connecting unit PR_U, while the third global data bus GIO_LD and the fourth global data bus GIO_RD can be connected through the second data bus connecting unit PR_D. Each of the first and the second global data bus connecting units PR_U, PR_D includes a bi-directional pipe register corresponding to the number of lines of the global data bus, e.g, 512.

The transfer buses TB are local data buses, each connecting the bit line sense amplifier of each bank to the bus connecting unit TL for the corresponding bank. The number of lines of each transfer bus TB is equal to the number of cells in the segment, e.g., 512. Each transfer bus TB is formed as a differential bus.

Each of the transfer bus connecting units TG may be formed with a number of MOS transistors corresponding to the number of lines of the transfer bus TB. Because the transfer bus TB is the differential bus, the transfer bus connecting unit TG can be formed with 512 pairs of MOS transistors. From this, the transfer bus connecting units TG are called as transfer gates.

The bus connecting units TL are 16 sets, each set having 512 transfer latches. Each bus connecting unit TL is formed with a read bus connecting circuit (corresponding to an IO sense amplifier of a DRAM) and a write bus connecting circuit (corresponding to a write driver of a DRAM). Here, the read bus connecting circuit includes a read sense amplifier for sensing and latching read data loaded on the transfer bus TB, and a read driver for driving the latched data to the global data bus in the quarter plane in which the corresponding banks are arranged. The write bus connecting circuit includes a write latch for sensing and latching write data loaded on the global data bus, and a write driver for driving the write data to the transfer bus TB.

Each of the data transferring units QTRX includes 512 transmitters QTx for transferring the write data that is applied to the corresponding port to the global data bus, and 512 receivers QRx for receiving the read data that is applied from the global data bus to transfer it to the corresponding port.

The suggested 256M multi-port DRAM further comprises a voltage generators arranged at the respective corners of the die for receiving an external voltage to generate an inner voltage, test logics arranged between the ports in the first quarter plane and the ports in the second quarter plane and between the ports in the third quarter plane and the ports in the fourth quarter plane, and other pads such as a clock pad that is arranged in the boundary of the die, which are not shown in Figures for the sake of simplicity.

In each quarter plane, there are included command lines ACT, PCG, RD, WD between the arbitrating unit 100 and the banks, and address lines ASS<0:1>, PAA<0:1>, RAA<0:1>, WAA<0:1>, RA<0:12>, RSA<0:1>, WSA<0:1> between the arbitrating unit 100 and the banks. There are included transfer gate control lines TGC<0:3> in each side of the arbitrating unit 100 between the arbitrating unit 100 and the transfer bus connecting units TG.

FIG. 2 shows a diagram for explaining relationship between the transfer bus and the segment that is a column unit of a 256M multi-port DRAM in FIG. 1.

Referring to 2, the suggested 256M multi-port DRAM includes a number of memory cell arrays 200 and a number of bit line sense amplifier arrays 210 as a typical DRAM. Considering one of memory cell arrays 200, a pair of transfer buses TB<0>, TBb<0> are connected to four bit line sense amplifiers BLSA that are arranged on upper and lower sides of the memory cell array 200 (see a box A). The four bit line sense amplifiers BLSA are controlled by respective segment selecting signals SGS<0:3>. The segment selecting signals correspond to column selecting signals Yi of the typical DRAM. Accordingly, in case of 2 k columns, when a row and a segment are selected, 512 cells are selected simultaneously so as to exchange data with the corresponding 512-bit transfer bus TB<0:511>.

On the other hand, the respective transfer buses TB corresponding to the respective banks in the first quarter plane can be connected to the respective transfer buses TB corresponding to the respective banks in the third quarter plane of the same column through the transfer gates TG (totally, 8 sets, each set having 512 transfer gates). That is, each of the transfer gates TG is arranged between the transfer buses TB corresponding to the banks in the same column (i.e., the array) to selectively connect the two transfer buses. The control signal TGC for controlling the transfer gates TG is generated in the arbitrating unit 100.

It will be described for the operation of the 256M multi-port DRAM as prescribed.

FIG. 3a describes a diagram of a 256M multi-port DRAM normal read path in FIG. 2 and FIG. 3b describes a diagram of a 256M multi-port DRAM normal write path in FIG. 2.

First, it will be described for a case where 512-bit data of a particular segment in the bank bank0 is read through the port port0.

Referring to FIG. 3a, when a command and an address related to the read operation are applied as packets through the port port0, the arbitrating unit 100 first generates the inner activating command signal ACT, the activating array address AAA and the row address RA for that bank bank0 to activate a particular row (wordline, WL) and, in turn, generates the inner read command signal RD, the read array address RAA and the read segment address RSA for that bank bank0. Accordingly, the bit line sense amplifier BLSA senses and amplifies the 512-bit data of the segment corresponding to the read segment address RSA to drive to the transfer buses TB, TBb. On the other hand, the bus connecting unit TL of the bank bank0 senses the read data on the transfer buses TB, TBb of the bank bank0 to driver the data to the first global data bus GIO_LU. In turn, the read data that is transferred to the first global data bus GIO_LU is stored in the read buffer in the port port0 via the receiver QRx of the data transferring unit QTRX corresponding to the port port0. The read data that is stored at the read buffer is converted into packets having a particular unit and transmitted in serial data format to the target device that is connected to the port port0. After that, the arbitrating unit 100 desirably deactivates the corresponding row by generating the inner deactivating command signal PCG and the deactivating array address PAA. At this time, the transfer bus connecting unit TG of the corresponding array goes to switch-off state so as to disconnect the transfer buses TB, TBb of the bank bank0 from the transfer buses of the bank bank1 in the same array. Here, notations 'BL, BLb' depict a pair of the bit lines, 'T' depicts a cell transistor, and 'C' depicts a cell capacitor.

Next, it will be described for a case where data (512-bit) is written in a particular segment in the bank bank0 through the port port0.

Referring to FIG. 3b, when a command, an address and data related to the write operation are applied as packets through the port port0, the arbitrating unit 100 first generates the inner activating command signal ACT, the activating array address AAA and the row address RA for that bank bank0 to activate a particular row (wordline, WL) and, in turn, generates the inner write command signal WT, the write array address WAA and the write segment address WSA for that bank bank0. At that time, based on scheduling of the arbitrating unit 100, the 512-bit data that is stored at the write buffer of the port port0 is recorded in the segment (512 memory cells) corresponding to the write segment address WSA. The data is converted to parallel data at the port port0 and, in turn, loaded on the first global data bus GIO_LU through the transmitter QTx of the data transferring unit QTRX. The loaded data is driven to the transfer buses TB, TBb of the bank bank0 through the bus connecting unit TL of the bank bank0. Then, the data on the transfer buses TB, TBb is stored at the 512 memory cells through the bit line sense amplifier BLSA corresponding to the write segment address WSA. After that, the arbitrating unit 100 generates the inner deactivating command signal PCG and the deactivating array address PAA to deactivate the row of the corresponding array.

FIG. 4a offers a diagram of a 256M multi-port DRAM cross read path in FIG. 2 and FIG. 4b offers a diagram of a 256M multi-port DRAM cross write path in FIG. 2.

First, it will be described for a case where 512-bit data in a particular segment in the bank bank0 is read through the port port1.

Referring to FIG. 4a, it is similar to the operation of the normal read operation as prescribed except that the transfer bus connecting unit TG of the corresponding array is switched on so as to connect the transfer buses TB, TBb of the bank bank0 to the transfer buses TB, TBb of the bank bank1 in the same array. On the other hand, the data that is loaded on the transfer buses TB, TBb of the bank bank1 is transferred to the target device through the bus connecting unit TL corresponding to the bank bank1, the third global data bus GIO_LD, the data transferring unit QTRX corresponding to the port port1 and the port port1.

Next, it will be described for a case where 512-bit data is written in a particular segment in the bank bank0 through the port port1.

Referring to FIG. 4b, it is similar to the operation of the normal write operation as prescribed except that the transfer bus connecting unit TG is switched on so as to connect the transfer buses TB, TBb of the bank bank0 to the transfer buses TB, TBb of the bank bank1 in the same array. In such a case, the data that is applied to the port port1 is loaded to the transfer buses TB, TBb of the bank bank0 through the data transferring unit QTRX corresponding to the port port1, the third global data bus GIO_LD and the bus connecting unit TL corresponding to the bank bank1. The operation from then is similar to that of the normal write.

On the other hand, when data exchange is requested between the first global data bus GIO_LU and the second global data bus GIO_RU, the two global data buses are connected to each other through the first global data bus connecting unit PR_U. When data exchange is requested between the third global data bus GIO_LD and the fourth global data bus GIO_RD, the two global data buses are connected to each other through the second global data bus connecting unit PR_D.

As described above, the suggested multi-port DRAM is capable of accessing all the segments from any port port0–port7 and independently accessing through a number of ports as long as the global data bus is not simultaneously required so that simultaneous multi access can be achieved. Further, with applying new architecture, 512-bit data can be processed in parallel in each quarter of the core region and inputted/outputted serially to/from the ports. Accordingly, increase of layout can be minimized, packaging can be facilitated and bandwidth can be dramatically increased without any skew problem between data lines in the data bus.

FIG. 5 represents a diagram of a data transfer structure of a 256M multi-port DRAM in FIG. 1.

Referring to FIG. 5, the multi-port DRAM has global data buses GIO for exchanging data between the input/output interface ports and memory cell block banks. Further, the data transferring units QTRX are included for data transceiving between the global data buses GIO and the ports, and the bus connecting units TL are included for data transceiving between the global data buses GIO and the banks.

FIG. 6 illustrates a diagram of a global data bus GIO of a 256M multi-port DRAM in FIG. 1.

Referring to FIG. 6, the entire chip is divided into four quarter planes Quarter_lu, Quarter_ru, Quarter_ld, Quarter_rd, each capable of operating as an independent DRAM. The construction schemes of the quarter planes, Quarter_lu, Quarter_ru, Quarter_ld, Quarter_rd are similar to each other. For example, considering the first quarter plane Quarter_lu, the four banks, the two ports and the global data bus connecting unit PR_U are connected to the global data bus GIO. That is, 7 branches are connected to one branch. When one global data bus GIO is shared by several elements, loading problem for the global data bus GIO and data interference problem can occur.

FIG. 7 illustrates the worst read case and the worst write case of a 256M multi-port DRAM in FIG. 1.

Referring to FIG. 7, the global data bus GIO includes 512 bus lines and is formed with horizontal leads and vertical leads. For the typical silicon process, the vertical leads are implemented with first metal leads and the horizontal leads are implemented with second metal leads. The reason for using such a layered metal lead structure is for leading facilitation. Typically, the resistance of the first metal leads in the lower layer is higher than that of the second metal leads. However, the lengths of the vertical leads (the first metal leads) happen to be different line by line, which make the loading values of the bus lines different from each other.

In addition to the difference of the loading values of the bus lines, loading values can be varied depending on data transmission path. For example, when read or write is performed between the port port0 and the bank bank6, the data transmission path is longest and, accordingly, loading of the global data bus GIO is highest. However, this can be changed depending on the line arrangement of the global data bus GIO and, therefore, the data transmission between the port port0 and the bank bank6 should not be considered always as the worst case.

As described above, the suggested multi-port DRAM includes the global data bus GIO having a wide bandwidth of 512 bits. Compared to the conventional DRAM (DDR2) of the largest bandwidth having 64 bus lines, this DRAM can be considered as having much more bus lines.

When the number of the lines of the global data bus is equal or less than 64, current consumption is not a serious problem even if data that is transferred through the bus is fully swung up to a core voltage level Vcc. However, when the number of the lines of the global data bus is larger than 64, i.e., it is increased to 128, 256 or 512, a large amount of current should be consumed, which leads a power problem.

In order to resolve such a power problem in the wide bandwidth global data bus, the invertors of the present invention have suggested a global data bus transmit/receive structure using a current sensing scheme instead of the conventional voltage driving scheme (see Korean Patent Application no. 2003-94697 filed on Dec. 22, 2003).

FIG. 8 provides a circuit diagram of a transmitter and a receiver of a data transfer unit QTRX and a bus connecting unit TL according to Korean Patent Application no. 2003-94697.

Referring to FIG. 8, the transmitter TX of the bus connecting unit TL includes NMOS transistors N5, N6 sequentially connected between the global data bus GIO and a ground voltage vss and having a data signal TX1 and a data driving pulse DP1 as their gate inputs, respectively.

The receiver RX of the bus connecting unit TL includes a PMOS transistor P1 having a source coupled to the power voltage VDD and a drain diode-coupled to its gate, a PMOS transistor P2 having a source coupled to the power voltage VDD and a drain coupled to an output node, an NMOS transistor N1 having a drain coupled to the global data bus GIO and a gate receiving a reference voltage VR, an NMOS transistor N2 having a source coupled to the drain (the output node) of the PMOS transistor P2 and a gate receiving the reference voltage VR, and an NMOS transistor N9 having a source coupled to the drain of the NMOS transistor N2, a drain coupled to the ground voltage vss and a gate receiving a data evaluation signal EVAL1.

On the other hand, the transmitter QTX of the data transferring unit QTRX includes NMOS transistors N7, N8 sequentially connected between the global data bus GIO and the ground voltage vss and having a data signal TX2 and a data driving pulse DP2 as their gate inputs, respectively.

The receiver QRX of the data transferring unit QTRX includes a PMOS transistor P3 having a source coupled to the power voltage VDD and a drain diode-coupled to its gate, a PMOS transistor P4 having a source coupled to the power voltage VDD and a drain coupled to an output node, an NMOS transistor N3 having a source coupled to the drain of the PMOS transistor P3, a drain coupled to the global data bus GIO and a gate receiving the reference voltage VR, an NMOS transistor N4 having a source coupled to the drain (the output node) of the PMOS transistor P4 and a gate receiving the reference voltage VR, and an NMOS transistor N10 having a source coupled to the drain of the NMOS transistor N4, a drain coupled to the ground voltage vss and a gate receiving a data evaluation signal EVAL2.

On the other hand, the global data bus GIO is actually formed with long metal leads, which can be modeled by an equivalent resistor R and capacitor C. Switches that exist between the respective bus connecting units TL and the global data bus GIO are for the respective banks and the respective bus lines as shown in FIG. 9, which will be described in the following.

Data transmission between the transmitter TX of the bus connecting unit TL and the receiver QRX of the data transferring unit QTRX through the global data bus GIO is called as read RD while data transmission between the transmitter QTX of the data transferring unit QTRX and the receiver RX of the bus connecting unit TL through the global data bus GIO is called as write WT.

In such a data transmission structure, the global data bus GIO is charged or discharged depending on the state of the data signals TX1, TX2 to be transmitted by the transmitters TX, QTX and the state of the global data bus GIO is sensed by the receivers RX, QRX.

FIG. 10a describes a timing diagram for normal data transmission of the circuit in FIG. 8.

It will be described for the operation of the circuit in FIG. 8 for the data transmission between the transmitter TX of the bus connecting unit TL and the receiver QRX of the data transferring unit QTRX, i.e., RD operation, for example.

The data driving pulse DP1 is activated to logic level high in synchronous to the clock for the read operation to load the data that is outputted from the bank on the global data bus GIO. The data evaluation signal EVAL2 is activated to logic level high some time after the time when the data driving pulse DP1 is activated to logic level high (the margin for charge or discharge of the global data bus GIO) to evaluate the data loaded on the global data bus GIO.

First, when both of the data signal TX1 and the data driving pulse DP1 that are inputted to the transmitter TX of the bus connecting unit TL are logic level high, the NMOS transistors N5, N6 are turned on to discharge the global data bus GIO. At this point, a voltage on a node A2 of the receiver QRX of the data transferring unit QTRX falls down under VDD-Vtp (the threshold voltage of the PMOS transistor), such that the PMOS transistors P3, P4 are turned on to make the output signal DATA2 of the receiver QRX of the data transferring unit QTRX logic level high. That is, the logic level high data can be transferred properly through the global data bus GIO.

Next, when the data signal TX1 is logic level low and the data driving pulse DP1 is logic level high, the global data bus GIO maintains charged state such that the node A2 of the receiver QRX of the data transferring unit QTRX is not discharged. Accordingly, the PMOS transistor P4 cannot strongly drive the output stage to logic level high. In such a situation, if the data evaluation signal EVAL2 goes to logic level high, the NMOS transistor N10 is turned on to discharge the output stage so as to make the output signal DATA2 of the receiver QRX of the data transferring unit QTRX logic level low. That is, the logic level low data can be transferred properly to the global data bus GIO.

As shown in FIG. 10a, there are four times of high period of the data driving pulse DP1, which means four times of data transmission. That is, it means there are two times transmission of high data and two times of transmission of low data.

However, for high data transmission, because the size of the PMOS transistor P4 is larger than the NMOS transistor N10, even though the output signal DATA2 does not falls down to logic level low even if the data evaluation signal EVAL2 is logic level high in a normal case, it can have fluctuation.

As shown in FIG. 10b, such a fluctuation can impact as noise during the initial operation, which leads erroneous recognition of the first high data.

Referring again to FIG. 9, there are switches SW0, SW2, SW4, SW6 between the respective bus connecting units TL corresponding to banks and the respective bus lines of the global data bus GIO. These switches are for selectively switching between the redundant column and the normal column.

During the initial operation, the global data bus GIO_LU is charged by the bus connecting unit TL corresponding to the bank and the data transferring unit QTRX corresponding to the port. When the global data bus GIO_LU transmits the first high data after a read or a write command is inputted, the NMOS transistors of the transmitter TX of the global data bus connecting unit PR_U for the corresponding bank or port and the NMOS transistor in the switch are not discharged enough, which leads data failure as shown in FIG. 10b.

FIG. 11 provides a block diagram of the conventional 256M multi-port DRAM for showing switches SW0, SW2, SW4, SW6 and a control block for the switches in FIG. 9.

Referring to FIG. 11, the conventional 256M multi-port DRAM comprises a pair of redundant transfer buses RTB', RTBb for the bank bank0, a redundant transfer latch RTL corresponding to the pair of the redundant transfer buses RTB', RTBb; 512 pairs of transfer buses TB'<0:511>. TBb'<0:511> corresponding to the 512-bit global data bus GIO_LU<0:511>, and a normal transfer latch TL corresponding to the 512 pairs of the transfer buses TB'<0:511>. TBb'<0:511>.

For the bank bank0, the conventional 256M multi-port DRAM further comprises a fuse ROM for generating a column redundant address YRAD<0:7> and a column redundant address enable signal YRAEN<0:3> for column repair, and a test logic having a logic for testing without fuse cutting in the fuse ROM and generating a redundancy test mode flag signal TM_YRED.

On the other hand, there are further comprised an NMOS transistor MN11 having the redundancy test mode flag signal TM_YRED as its gate input and arranged between the redundant transfer latch RTL and the first global data bus line GIO_LU<0>, an NMOS transistor NM12 arranged between each global data bus line GIO_LU<0:511> and the corresponding transfer latch TL for transferring the output signal RTB of each redundant transfer latch TL to the corresponding global data bus line GIO_LU<0:511>, an NMOS transistor MN13 for transferring the output signal TB<0:511> of each transfer latch TL to the corresponding global data bus line GIO_LU<0:511>, and a selecting logic for selectively turning on the NMOS transistors MN12, MN13 in response to the column redundant address YRAD<0:7>, the column redundant address enable signal YRAEN<0:3> and the redundancy test mode flag signal TM_YRED.

Here, the column redundant address YRAD<0:7>, the column redundant address enable signal YRAEN<0:3> are the column repair signals for replacing one of the 512 transfer latches TL with the redundant transfer latch RTL. The redundancy test mode flag signal TM_YRED provides a virtual fuse cutting situation for test without actually cutting the fuse in the fuse ROM.

FIG. 12 represents a circuit diagram of the selecting logic and switches in FIG. 11.

Referring to FIG. 12, the selecting logic corresponding to the first global data bus line GIO_LU<0> includes a NAND gate ND1 receiving the column redundant address YRAD<0> and the column redundant address enable signal YRAEN<0>, an inverter INV11 receiving the output signal of the NAND gate ND1, a NOR gate NOR11 receiving the output signal of the NAND gate ND1 and the redundancy test mode flag signal TM_YRED, and a NOR gate NOR12 receiving the output signal of the INV11 and the redundancy test mode flag signal TM_YRED.

Here, the NMOS transistor MN13 for transferring the output signal TB<0> of the transfer latch TL corresponding to the first global data bus line GIO_LU<0> to the global data bus line GIO_LU<0> is controlled by the output signal of the NOR gate NOR12. The NMOS transistor MN12 for transferring the output signal RTB of the redundant transfer latch RTL to the global data bus line GIO_LU<0> is controlled by the output signal of the NOR gate NOR11. On the other hand, the NMOS transistor MN11 for transferring the output signal RTB of the redundant transfer latch RTL to the first global data bus line GIO_LU<0> is controlled by the redundancy test mode flag signal TM_YRED.

Similarly, each of the rest of the global data bus lines includes such a selecting logic except that the inputted bit values of the column redundant address YRAD<0:7> and the column redundant address enable signal YRAEN<0:3> are different from those for the first global data bus line GIO_LU<0>.

If the redundancy test mode flag signal TM_YRED is activated to logic level high, the NMOS transistor MN11 is turned on and the NMOS transistors MN12, MN13 are turned off. Accordingly, the output signal RTB of the redundant transfer latch RTL is transferred to the first global data bus line GIO_LU<0> to enable test. Further, when the redundancy test mode flag signal TM_YRED is deactivated to logic level low, the NMOS transistor MN11 is turned ooff and the NMOS transistors MN12, MN13 are selectively turned on depending on the column redundant address YRAD<0> and the column redundant address enable signal YRAEN<0>.

On the other hand, because the program scheme for the fuse ROM is cutting the fuse for operation in advance, the switches are turned on with a DC voltage regardless of time. Accordingly, because the switches corresponding to all the banks are turned on regardless of actual operation, failure of the first high data cannot be avoid, as shown in FIG. 10b.

SUMMARY OF THE INVENTION

It is, therefore, a primary object of the present invention to provide a semiconductor memory device for avoiding first high data failure during initial operation in a global data bus transceiving structure of current sensing scheme.

In accordance with the present invention, there is provided a semiconductor memory device which comprises a global data bus having a multiplicity of bus lines, a plurality of banks having a current sensing type transceiving structure for exchanging data with the global data bus, one or more ports having a current sensing type transceiving structure for exchanging data with the global data bus, a plurality of switching units, each arranged between the corresponding bank and the bus lines of the global data bus for selectively connecting one of a redundant column and normal columns of the corresponding bank to the global data bus, and a controlling unit for restricting the turn-on period of the switching units to the substantial operation period of the corresponding bank.

Desirably, the switching unit in each bank includes a redundant bus connecting unit corresponding to the redundant column of the corresponding bank, a multiplicity of normal bus connecting units corresponding to the respective normal column of the corresponding bank, a plurality of first switches arranged between the normal bus connecting units and the respective bus lines of the global data bus, a plurality of second switches arranged between the redundant bus connecting unit and the respective bus lines of the global data bus, and a plurality of third switches arranged between the redundant bus connecting unit and predetermined one of the bus lines in the global data bus.

Desirably, the controlling means includes a fusing unit for generating a column redundancy information signal for the corresponding bank, a test logic having a logic for enabling test without cutting the fuse in the fusing unit, for generating a redundancy test mode flag signal, a switching control logic for generating a first and a second redundancy test mode flag pulses containing information about a period during which the corresponding bank substantially operates in normal mode and test mode in response to the redundancy test mode flag signal and a column command data driving signal, the second redundancy test mode flag pulse controlling the third switches, and a plurality of selecting logics for selecting one of the first and the second switches in the normal mode in response to the column redundancy information signal and the first redundancy test mode flag pulse.

Desirably, the switch control logic includes a bank operation period signal generating unit for generating a bank operation period signal that is activated during a period in which the corresponding bank substantially operates in response to a write data driving pulse for the corresponding bank and a read data driving pulse for the corresponding bank, a first redundancy test mode flag pulse generating unit for generating the first redundancy test mode flag pulse that defines the period in which the corresponding bank substantially operates in the normal mode in response to the redundancy test mode flag signal and the bank operation period signal, and a second redundancy test mode flag pulse generating unit for generating the second redundancy test mode flag pulse that defines the period in which the corresponding bank substantially operates in the test mode in response to the redundancy test mode flag signal and the bank operation period signal.

Desirably, the switch control logic includes a bank operation period signal generating unit for generating a bank operation period signal that is activated during a period in which the corresponding bank substantially operates in response to write data driving pulses for some other banks that share the global data bus with the corresponding bank and read data driving pulses for some other banks that share the global data bus with the corresponding bank, a first redundancy test mode flag pulse generating unit for generating the first redundancy test mode flag pulse that defines the period in which the corresponding bank substantially operates in the normal mode in response to the redundancy test mode flag signal and the bank operation period signal, and a second redundancy test mode flag pulse generating unit for generating the second redundancy test mode flag pulse that defines the period in which the corresponding bank substantially operates in the test mode in response to the redundancy test mode flag signal and the bank operation period signal.

Desirably, the bank operation period signal generating means includes a delay option for delaying a write data driving pulse for the corresponding bank by a time period corresponding to the delay time of the global data bus, and a NAND gate receiving a read data driving pulse for the corresponding bank and the delayed write data driving pulse for the corresponding bank from the delay option for outputting the bank operation period signal.

Desirably, the bank operation period signal generating means includes a first NAND gate receiving the write data driving pulse for the some other bank, a delay option for delaying the output signal of the first NAND gate by a time period corresponding to the delay time of the global data bus, a second NAND gate receiving the read data driving pulse for the some other bank, and a NOR gate receiving the output signal of the second NAND gate and the output signal of the delay option for outputting the bank operation period signal.

Desirably, the delay option has a number of inverters, a multiplicity capacitor coupled to the nodes between the inverters, and a plurality of switches for selectively connecting the respective capacitors to the nodes.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In the present invention, a multi-port memory device having data transceiving blocks (banks, ports) of a current sensing type data transceiving structure for exchanging data with a global data bus, employs a control logic for avoiding failure of the first high data by prohibiting switches between the banks and the global data bus lines, each switch selectively connecting a redundant column and normal columns of the corresponding bank to the global data bus, from being turned on unnecessarily for long time, the control logic restricting the turn-on period of each switch to the substantial operation period of the corresponding bank.

Hereinafter, with reference to the accompanying drawings, a preferred embodiment of the present invention will be explained in detail.

Figure 1:
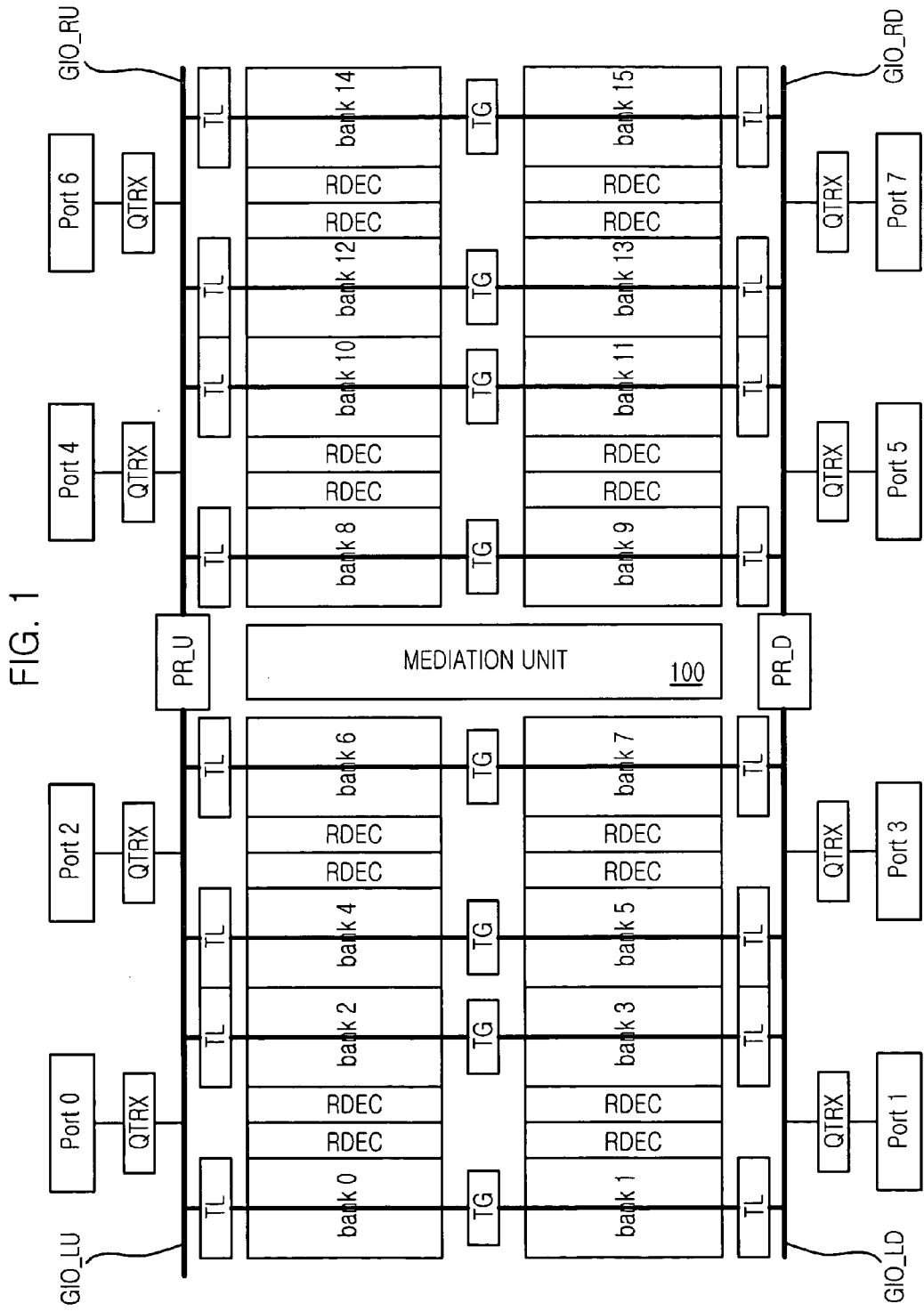
FIG. 1 provides a diagram of architecture of a 256M multi-port DRAM according to Korean Patent Application no. 2003-92375.
Figure 2:
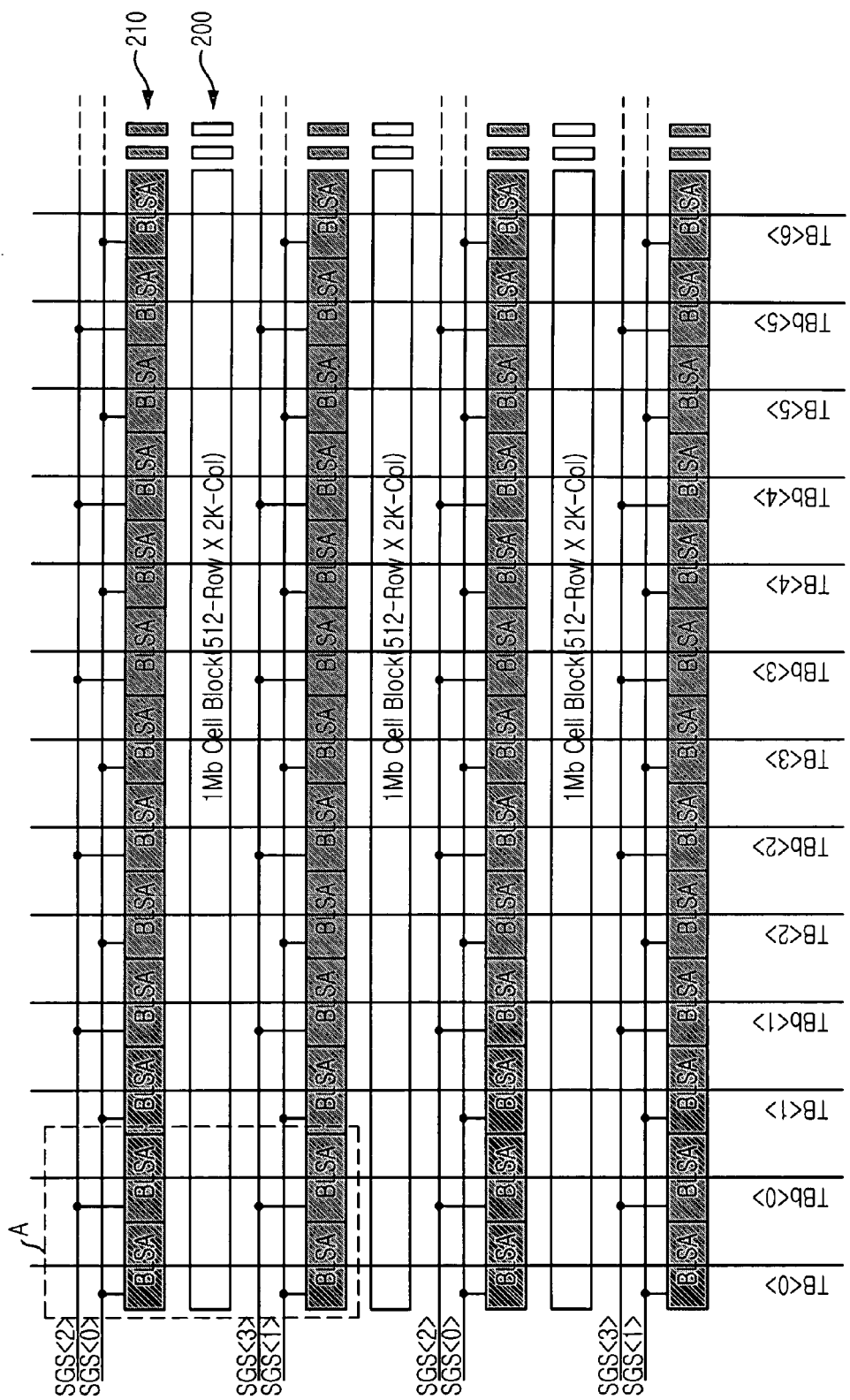
FIG. 2 shows a diagram for explaining relationship between a transfer bus and a segment that is a column unit of a 256M multi-port DRAM in FIG. 1.
Figure 3A:
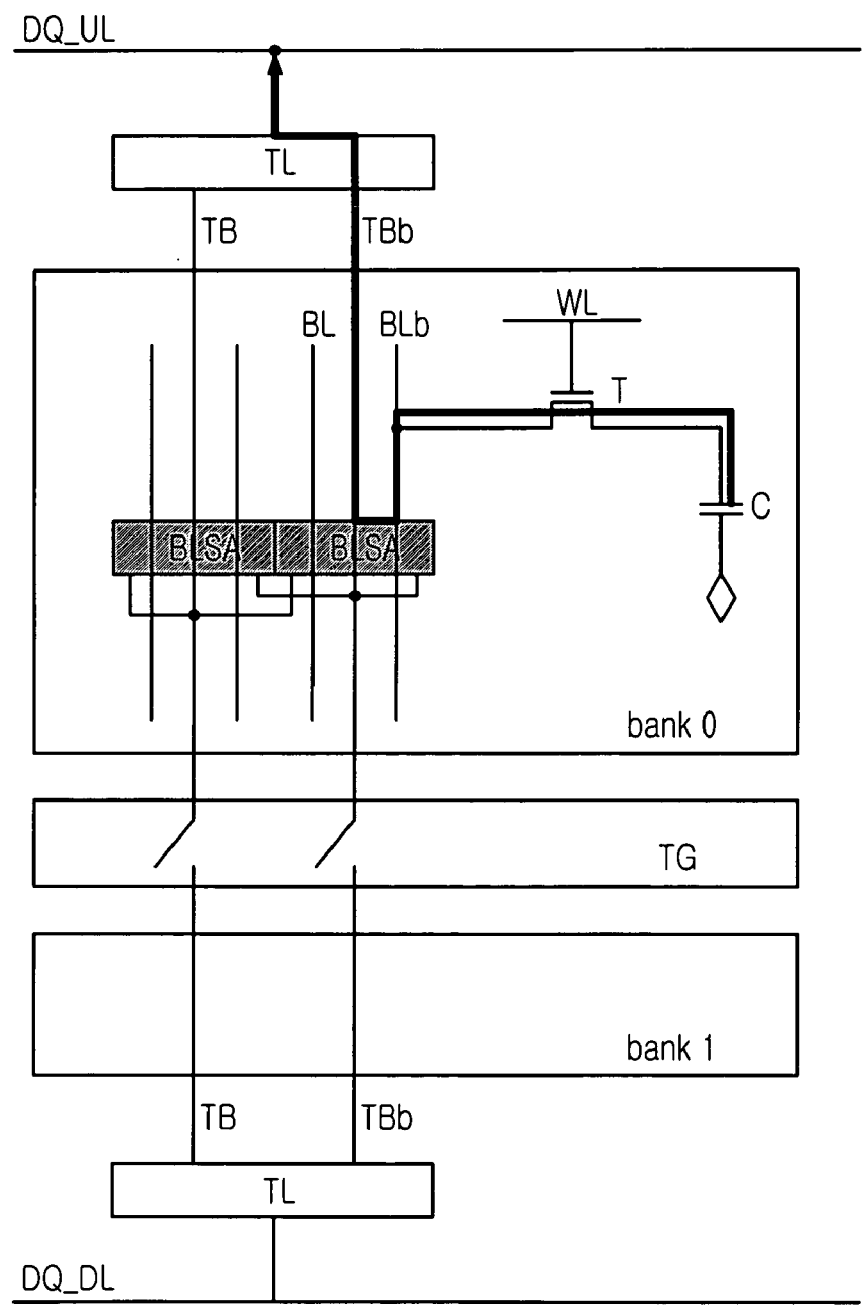
FIG. 3a describes a diagram of a 256M multi-port DRAM normal read path in FIG. 2.
Figure 3B:
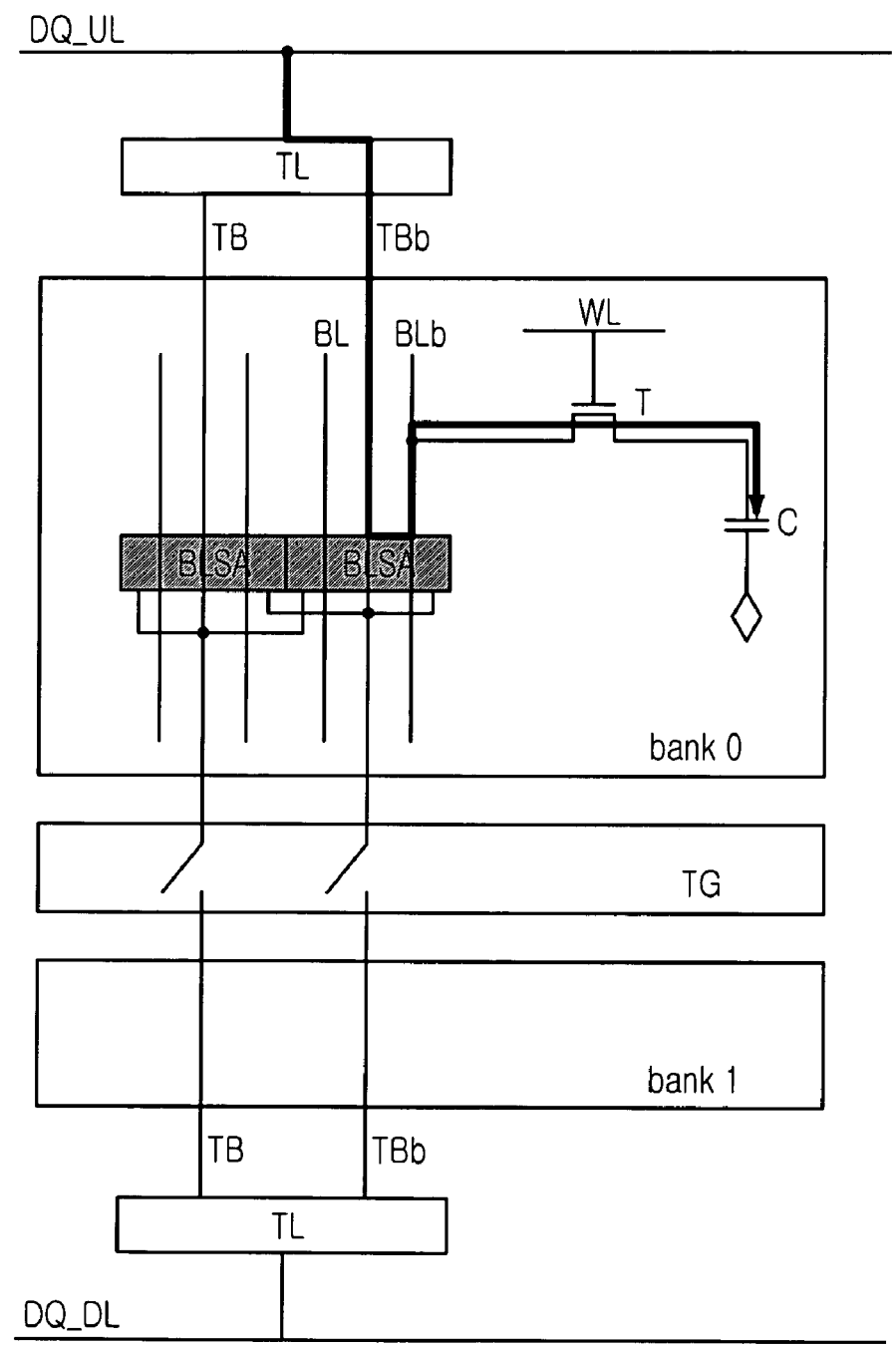
FIG. 3b describes a diagram of a 256M multi-port DRAM normal write path in FIG. 2.
Figure 4A:
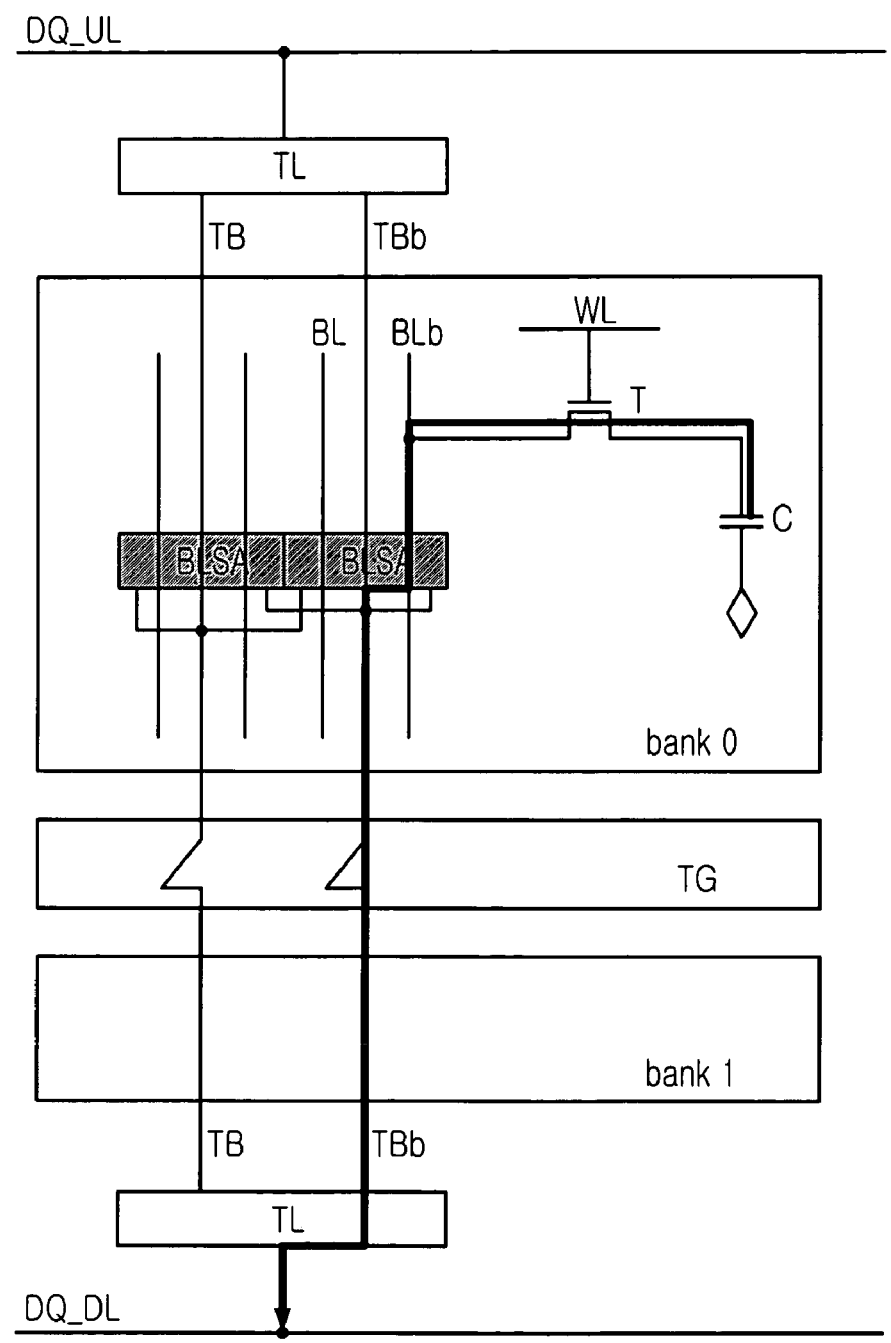
FIG. 4a offers a diagram of a 256M multi-port DRAM cross read path in FIG. 2.
Figure 4B:
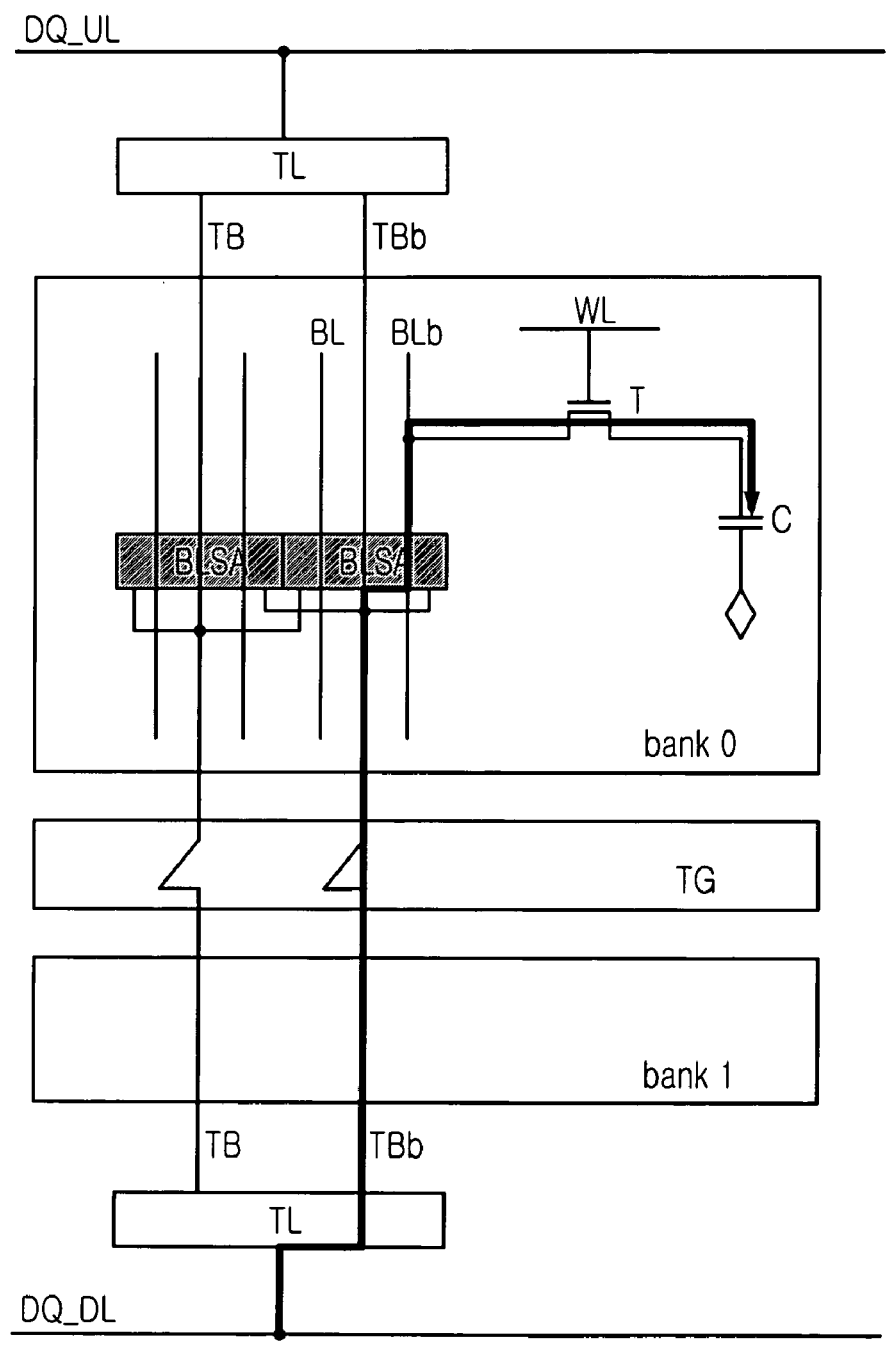
FIG. 4b offers a diagram of a 256M multi-port DRAM cross write path in FIG. 2.
Figure 5:
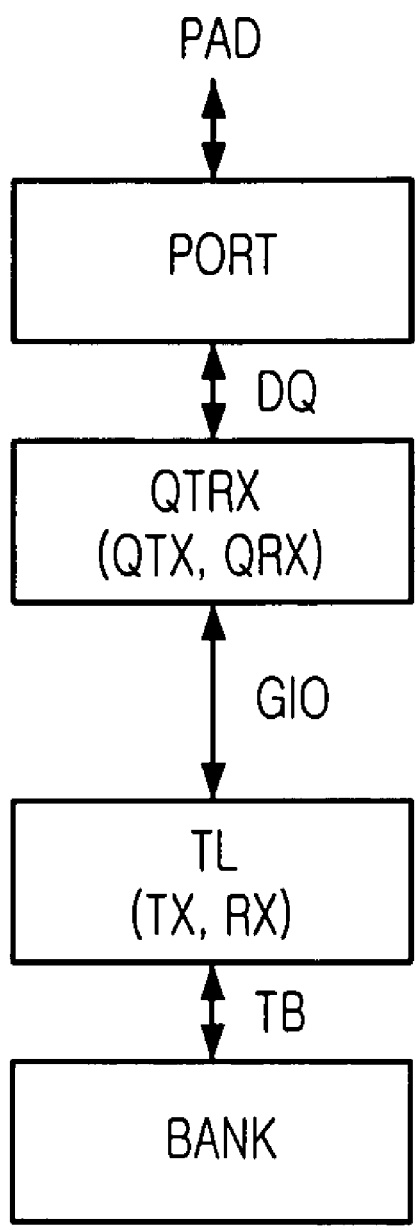
FIG. 5 represents a diagram of a data transfer structure of a 256M multi-port DRAM in FIG. 1.
Figure 6:
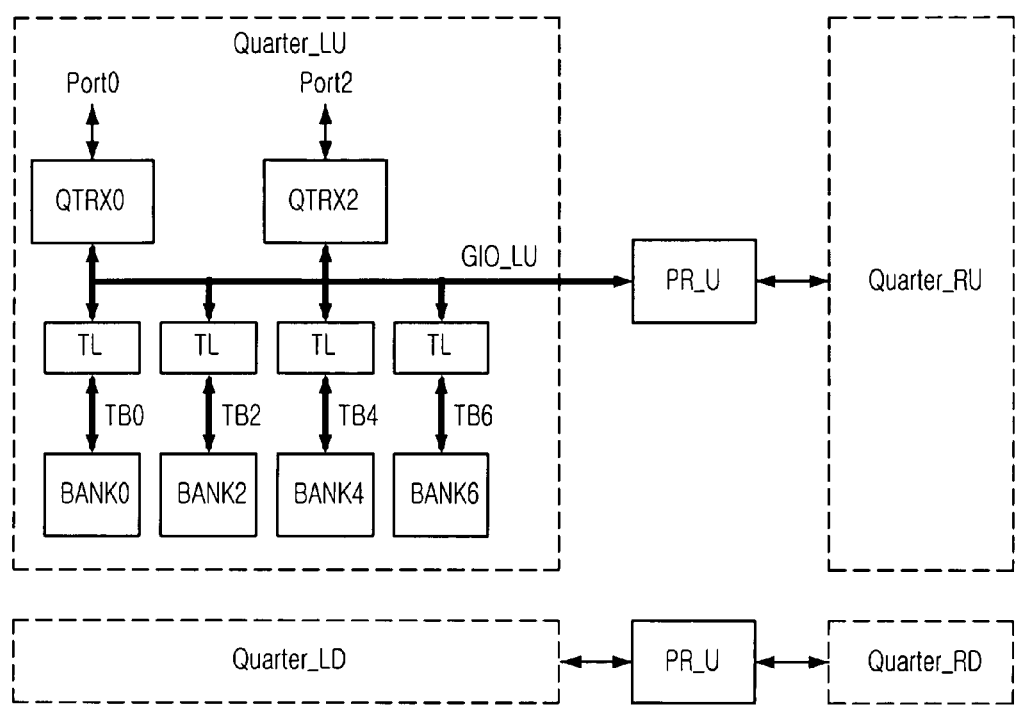
FIG. 6 illustrates a diagram of a global data bus GIO of a 256M multi-port DRAM in FIG. 1.
Figure 7:
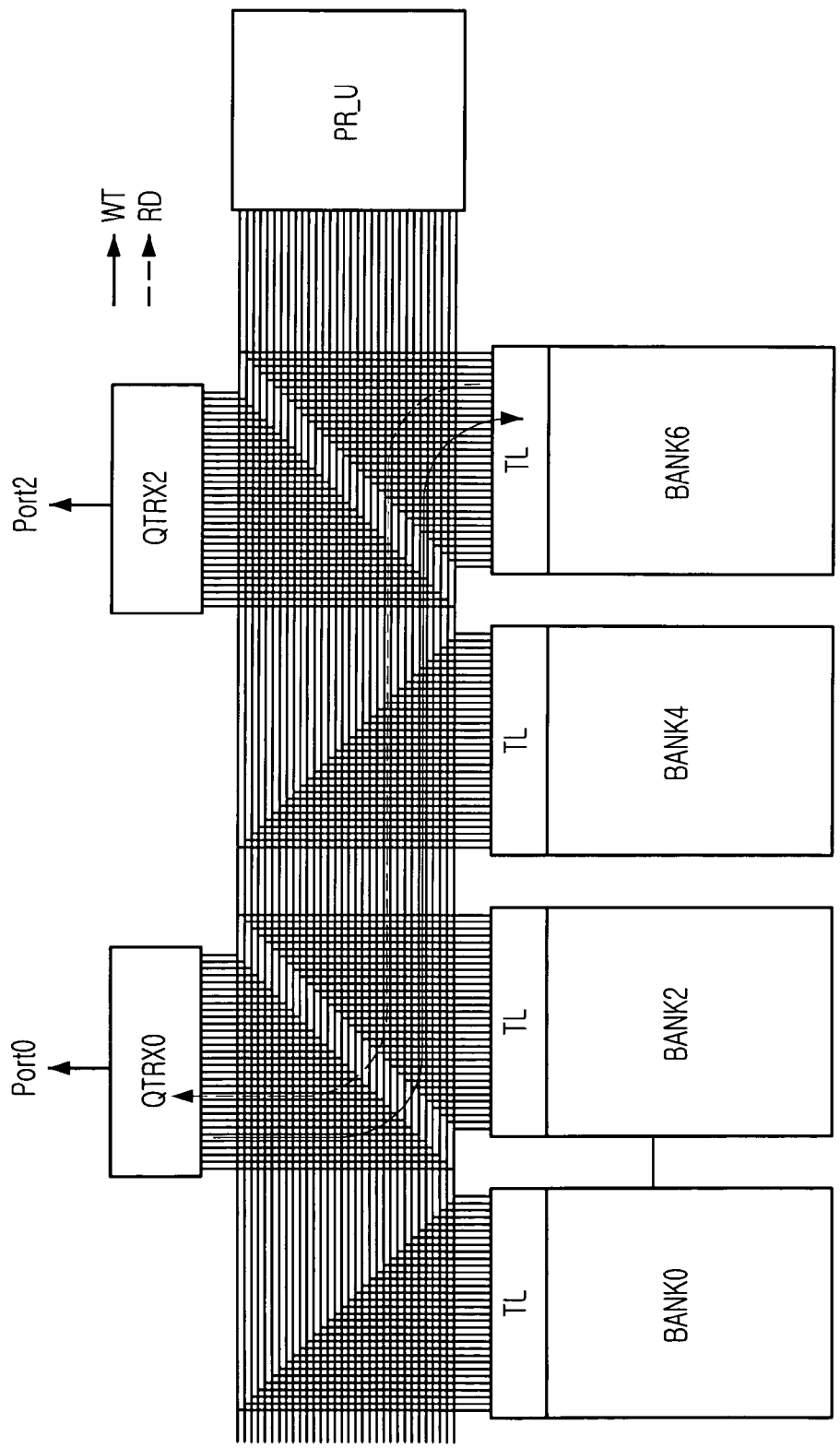
FIG. 7 illustrates the worst read case and the worst write case of a 256M multi-port DRAM in FIG. 1.
Figure 8:
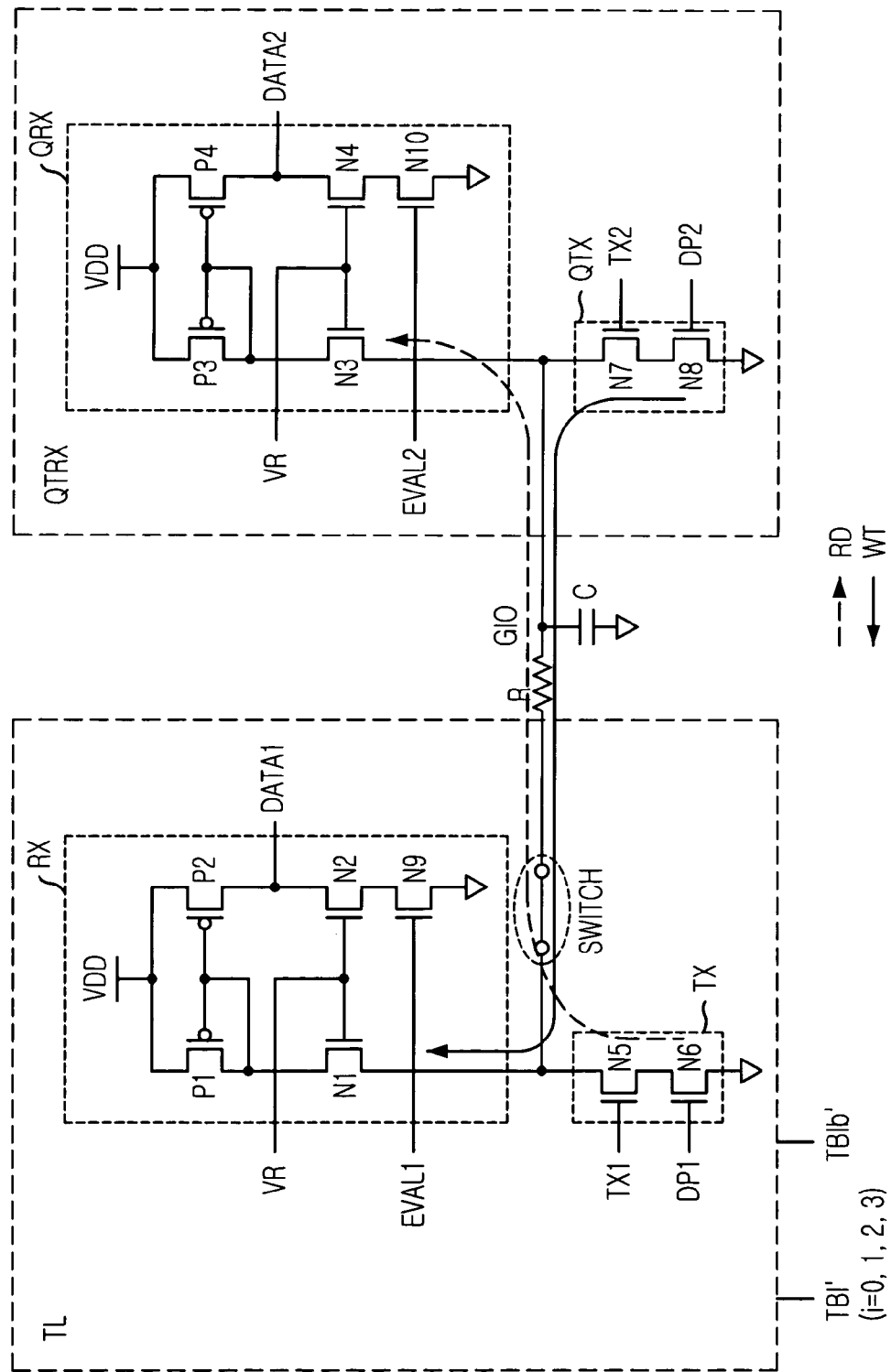
FIG. 8 provides a circuit diagram of a transmitter and a receiver of a data transfer unit QTRX and a bus connecting unit TL according to Korean Patent Application no. 2003-94697.
Figure 9:
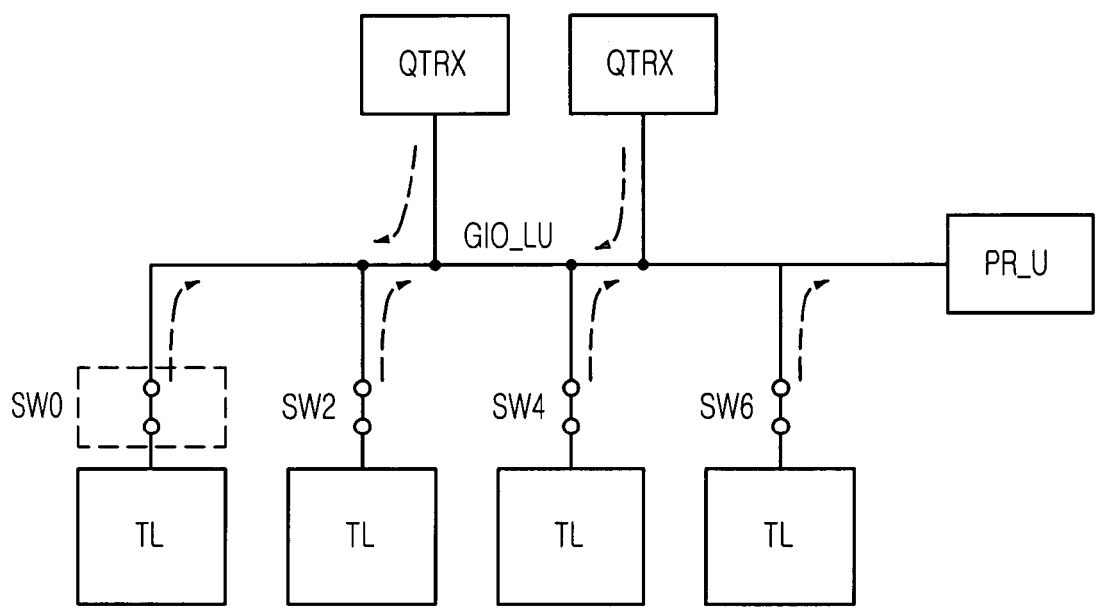
FIG. 9 shows a diagram of an initial voltage path for a global data bus.
Figure 13:
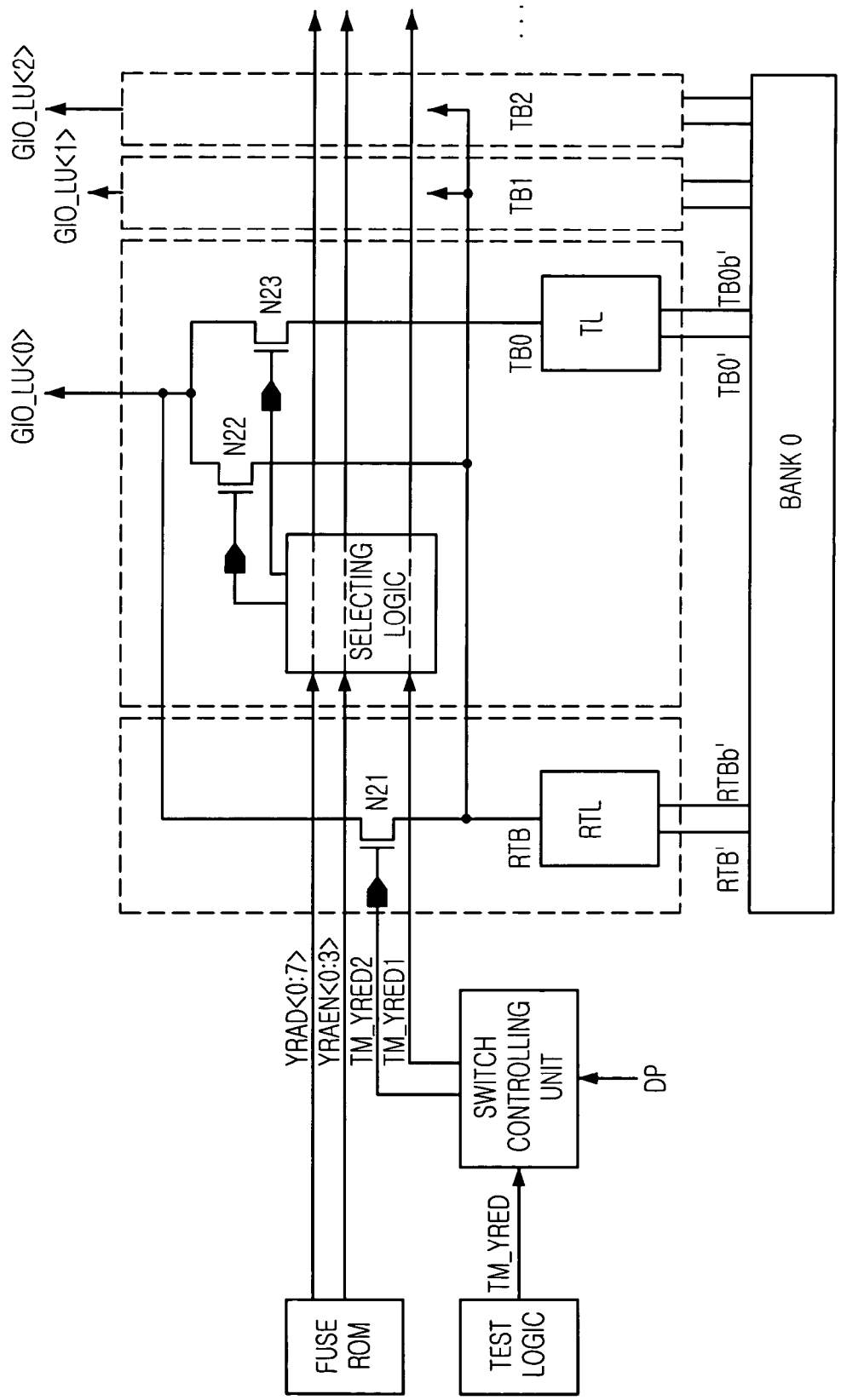
FIG. 13 illustrates a block diagram of switches SW0, SW2, SW4, SW6 and a control block therefor in FIG. 9 in a 256M multi-port DRAM according to one embodiment of the present invention.

FIG. 13 illustrates a block diagram of a 256M multi-port DRAM according to one embodiment of the present invention for showing the switches SW0, SW2, SW4, SW6 and a control block for the switches in FIG. 9.

Referring to FIG. 13, the 256M multi-port DRAM of the present invention includes, for a bank bank0, a pair of redundant transfer buses RTB', RTBb, a redundant transfer latch RTL corresponding to the pair of the redundant transfer buses RTB', RTBb, 512 pairs of transfer buses TB'<0:511>.

TBb'<0:511> corresponding to the 512-bit global data bus GIO_LU<0:511>, and a normal transfer latch TL corresponding to the 512 pairs of the transfer buses TB'<0:511>. TBb'<0:511>.

For the bank bank0, the 256M multi-port DRAM of the present invention further comprises a fuse ROM for generating a column redundant address YRAD<0:7> and a column redundant address enable signal YRAEN<0:3> for column repair, and a test logic, having a logic for testing without fuse cutting in the fuse ROM, for generating a redundancy test mode flag signal TM_YRED.

Figure 11:
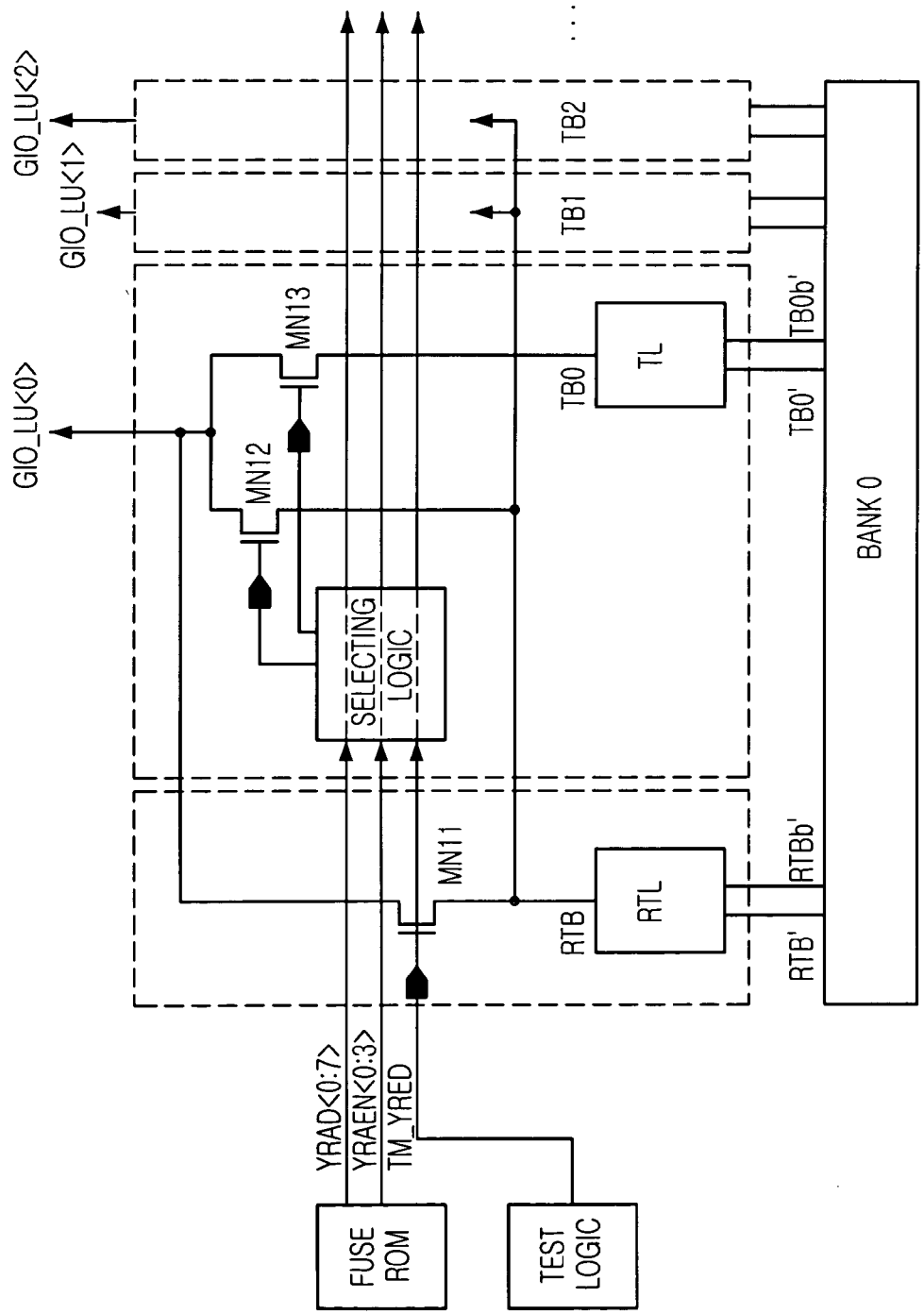
FIG. 11 provides a diagram of switches SW0, SW2, SW4, SW6 and a control block therefor in FIG. 9.

This part is as similar as the conventional device as shown in FIG. 11.

On the other hand, the 256M multi-port DRAM of the present invention further comprises a switch controlling unit for generating a first and a second redundancy test mode flag pulses TM_YRED1, TM_YRED2 containing information about the period during which the corresponding bank substantially operates in normal mode and test mode in response to a redundancy test mode flag signal TM_YRED and a column command data driving pulse DP.

Further, there are included an NMOS transistor MN21 arranged between the redundant transfer latch RTL and a first global data bus line GIO_LU<0> for receiving the second redundancy test mode flag pulse TM_YRED2 as its gate input, an NMOS transistor MN22 arranged between the respective global data bus lines GIO_LU<0:511> and the corresponding transfer latch TL for transferring the output signal RTB of the redundant transfer latch RTL to the corresponding global data bus line GIO_LU<0:511>, an NMOS transistor MN23 for transferring the output signal TB<0:511> of the transfer latch TL to the corresponding global data bus line GIO_LU<0:511>, and a selecting logic for selectively turning on the NMOS transistors MM22, MN23 in response to the column redundant address YRAD<0:7>, the column redundant address enable signal YRAEN<0:3> and the first redundancy test mode flag pulse TM_YRED1.

Here, the column redundant address YRAD<0:7>, the column redundant address enable signal YRAEN<0:3> are the column repair signals for replacing one of the 512 transfer latches TL with the redundant transfer latch RTL. The redundancy test mode flag signal TM_YRED provides a virtual fuse cutting situation without actually cutting the fuse in the fuse ROM for test.

Figure 14:
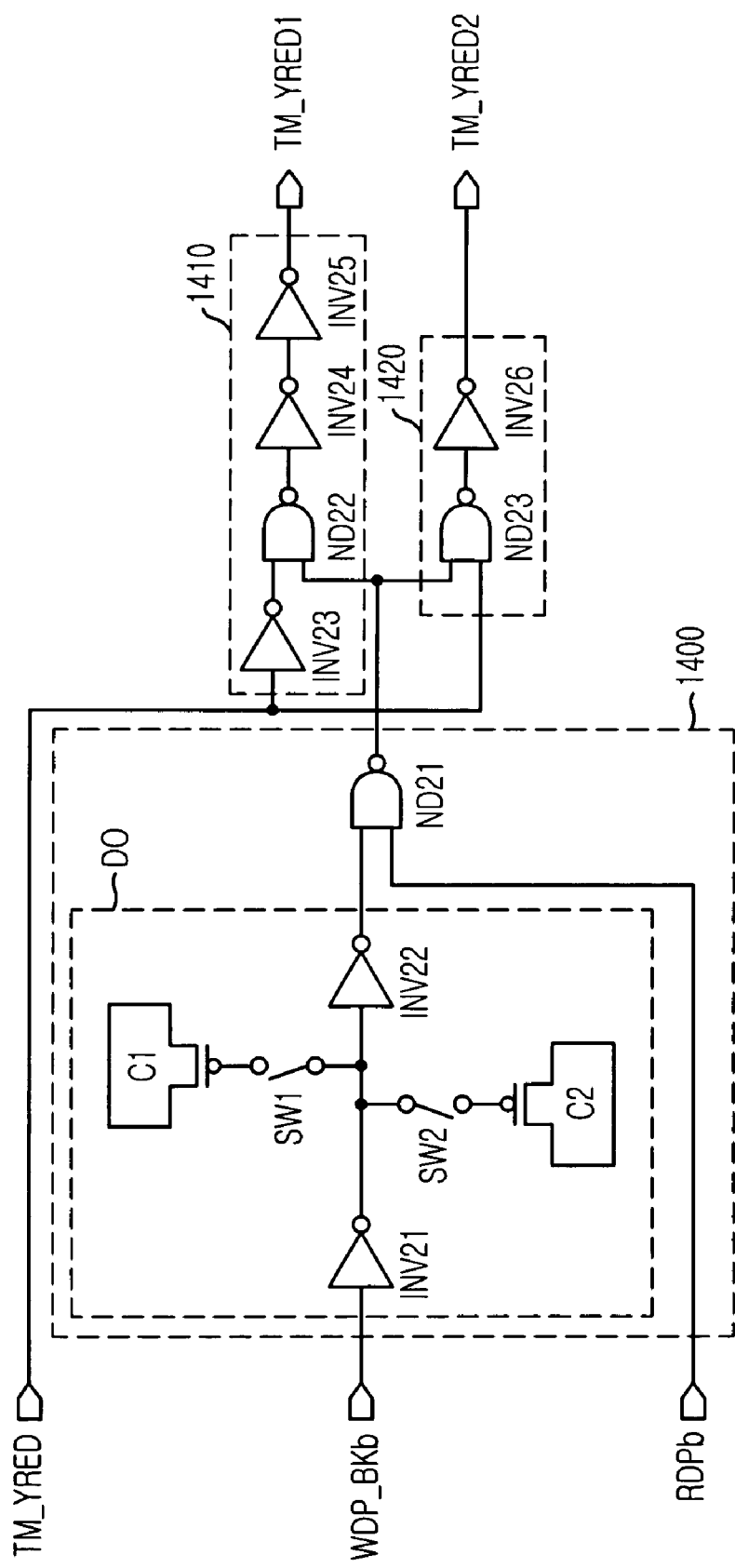
FIGS. 14 and 15 offer diagrams of circuits of the switch control unit in FIG. 13.

FIG. 14 offers diagrams of a circuit of the switch control unit in FIG. 13.

Referring to FIG. 14, the switch controlling unit includes a bank operation period signal generating unit 1400 for generating a bank operation period signal RDWT that is activated during a period when the corresponding bank substantially operates in response to the write data driving pulse WTP_BKb for the corresponding bank and the read data driving pulse RDPb for the corresponding bank, a first redundancy test mode flag pulse generating unit 1410 for generating the first redundancy test mode flag pulse TM_YRED1 defining the period during which the corresponding bank substantially operates in the normal mode in response to the redundancy test mode flag signal TM_YRED and the bank operation period signal RDWT, and a second redundancy test mode flag pulse generating unit 1420 for generating the second redundancy test mode flag pulse TM_YRED2 defining the period during which the corresponding bank substantially operates in the test mode in response to the redundancy test mode flag signal TM_YRED and the bank operating period signal RDWT.

Here, the bank operation period signal generating unit 1400 includes a delay option DO for delaying the write data driving pulse WDP_BKb, and a NAND gate ND21 receiving the read data driving pulse RDPb and the delayed write data driving pulse WDP_BKb from the delay option DO for outputting the bank operation period signal RDWT. The read data driving pulse RDPb is a low pulsing signal containing bank information for driving the transmitter TX of the transfer latch TL when data is transferred from the corresponding bank to the global data bus GIO. The write data driving pulse WDP_BKb is a low pulsing signal containing bank information for driving the transmitter QTX of the data transferring unit QTRX when data is transferred from the port to the global data bus GIO. On the other hand, the delay option DO models the delay between the time when the write data driving pulse WDP_BKb is activated at the transmitter QTX of the data transferring unit QTRX and the time when the write data driving pulse WDP_BKb arrives at the transfer latch TL of the corresponding bank through the global data bus GIO. In FIG. 14, for example, the delay option DO is formed with, but not limited to, inverters INV21, INV22, capacitors C1, C2 and switches sw1, sw2.

The first redundancy test mode flag pulse generating unit 1410 includes an inverter INV23 receiving the redundancy test mode flag signal TM_YRED, a NAND gate ND22 receiving the output signal of the inverter INV23 and the bank operation period signal RDWT, an inverter INV24 receiving the output signal of the NAND gate ND22, and an inverter INV25 receiving the output signal of the inverter INV24 to output the first redundancy test mode flag pulse TM_YRED1.

On the other hand, the second redundancy test mode flag pulse generating unit 1420 includes a NAND gate ND23 receiving the redundant test mode flag signal TM_YRED and the bank operation period signal RDWT, and an inverter INV26 receiving the output signal of the NAND gate ND23 to output the second redundancy test mode flag pulse TM_YRED2.

As described above, the bank operation period signal RDWT is activated to logic level high during the period when the corresponding bank substantially operates.

First, when the redundancy test mode flag signal TM_YRED is logic level low, i.e., in the normal mode, the second redundancy test mode flag pulse TM_YRED2 maintains its state in logic level low so as to maintain the NMOS transistor N21 in FIG. 13 turned off, and the first redundancy test mode flag pulse TM_TRED is in logic level low during the period while the corresponding bank substantially operates, which is inputted to the selecting logic in FIG. 13 to selectively turn on of the NMOS transistors MN22, MN23 in FIG. 13.

Next, when the redundancy test mode flag signal TM_YRED is logic level high, i.e., in the test mode, the second redundancy test mode flag pulse TM_YRED2 maintains its state in logic level high during the period while the corresponding bank substantially operates so as to keep the NMOS transistor N21 in FIG. 13 turned on during the corresponding period, and the first redundancy test mode flag pulse TM_YRED1 is in logic level high, which is inputted to the selecting logic in FIG. 13 so as to turn off the NMOS transistors MN22, MN23 in FIG. 13.

Figure 10A:
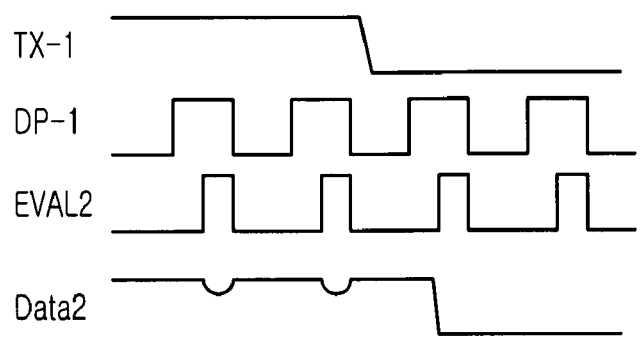
FIG. 10a describes a timing diagram for normal data transmission of a circuit in FIG. 8.
Figure 10B:
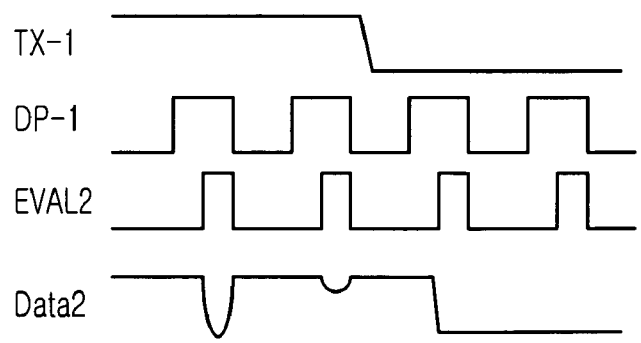
FIG. 10b describes a timing diagram for abnormal data transmission of a circuit in FIG. 8.

That is, in accordance with the present invention, by making the switches (the switches SW0, SW2, SW4, SW6 in FIG. 9) between the banks and the global data bus operate in the test mode and the normal mode only when the respective banks substantially operates, the global data bus can be discharged rapidly when the first high data is transferred to the global data bus GIO and, as a result, data failure as shown in FIG. 10b can be avoided.

Figure 15:
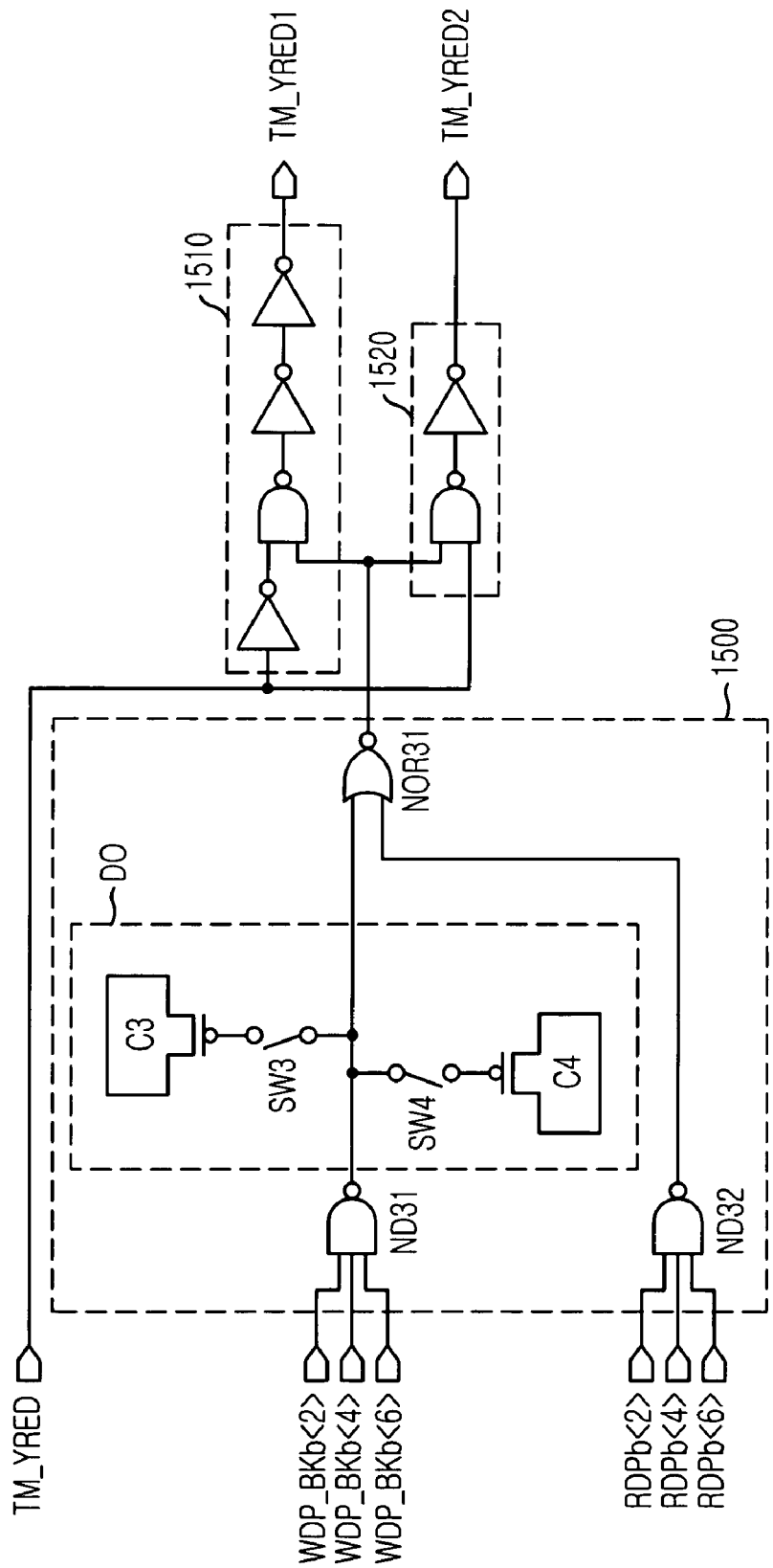

FIG. 15 offers a diagram of another circuit of the switch control unit in FIG. 13.

Referring to FIG. 15, the switch controlling unit includes a bank operation period signal generating unit 1500, a first redundancy test mode flag pulse generating unit 1510, and a second redundancy test mode flag pulse generating unit 1520.

Here, the bank operation period signal generating unit 1500 includes a NAND gate ND31 receiving a write data driving pulse WDP_BKb<2>, WDP_BKb<4>, WDP_BKb<6> for some other banks that share the global data bus GIO with the corresponding bank, a delay option DO for delaying the output signal of the NAND gate ND31, a NAND gate ND32 receiving the read data driving pulses RDPb<2>, RDPb<4>, RDPb<6> for some other banks that share the global data bus GIO with the corresponding bank, and a NOR gate NOR31 receiving the output signal of the NAND gate ND32 and the output signal of the delay option DO to output the bank operation period signal RDWT. Here, the delay option DO is used for the same purpose as described with referring to FIG. 14 and, for example, formed with, but not limited to, capacitors C3, C4 and switches sw3, sw4, which can be changed depending on the amount of the delay.

The construction of the first redundancy test mode flag pulse generating unit 1510 and the second redundancy test mode flag pulse generating unit 1520 is as similar as construction of the first redundancy test mode flag pulse generating unit 1410 and the second redundancy test mode flag pulse generating unit 1420 and description for that will be omitted for sake of simplicity.

The switch controlling unit in FIG. 15 is different from that in FIG. 14 in the way of generating the bank operation period signal RDWT. That is, while the circuit in FIG. 14 uses the signal that is activated when the corresponding bank substantially operates, the circuit in FIG. 15 uses the signal that is activated when the rest of the banks that share the global data bus with the corresponding bank substantially operate, i.e., when the corresponding bank does not operate, in a negative concept.

Figure 12:
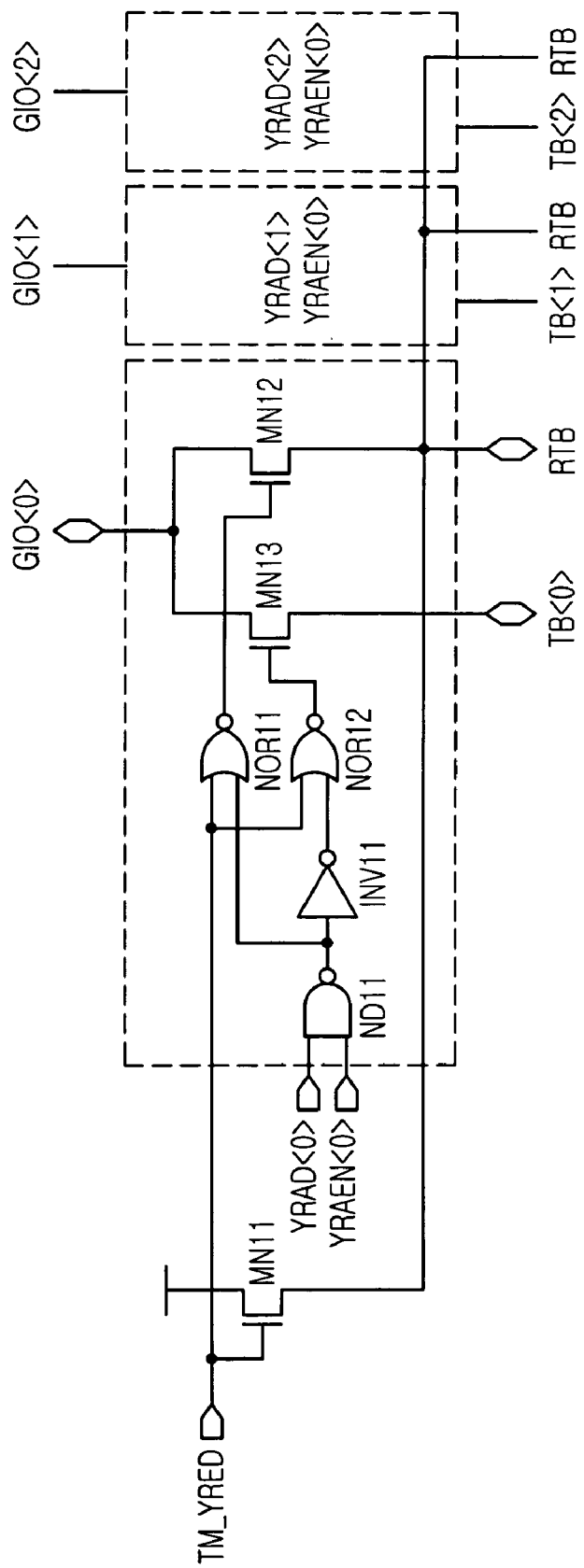
FIG. 12 represents a circuit diagram of a selecting logic and switches in FIG. 11.

Further, the operation of the switch controlling unit, the selecting logic (see FIG. 12) and the switches (SW0, SW2, SW4, SW6 in FIG. 9) is as similar as described referring to FIG. 14.

For example, it is described for the case of using a DRAM cell, it should be understood that the present invention may be applied to cases of using other type RAM cells such as a SRAM cell.

Further, it is described for the case of using a unit segment of 512-bit, it should be understood that the present invention may be applied to cases of some other number of bits for the unit segment.

Further, the number of ports and the number of banks in the prescribed embodiment can be changed depending on capacitance of the memory device.

As described above, the present invention can avoid failure of the first high data during initial operation in a multi-port memory device so that reliability and operation characteristic of the memory device can be improved.

The present application contains subject matter related to Korean patent applications No. 2004-31969, filed in the Korean Patent Office on May 6, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A multi-port memory device comprising:

a global data bus having a multiplicity of bus lines;

a plurality of banks having a current sensing type transceiving structure for exchanging data with the global data bus;

one or more ports having a current sensing type transceiving structure for exchanging data with the global data bus;

a plurality of switching means, each arranged between the corresponding bank and the bus lines of the global data bus for selectively connecting one of a redundant column and normal columns of the corresponding bank to the global data bus; and controlling means for restricting the turn-on period of the switching means to the substantial operation period of the corresponding bank.

2. The multi-port memory device of claim 1, wherein the switching means in each bank includes:

redundant bus connecting means corresponding to the redundant column of the corresponding bank;

a multiplicity of normal bus connecting means corresponding to the respective normal column of the corresponding bank;

a plurality of first switches arranged between the normal bus connecting means and the respective bus lines of the global data bus;

a plurality of second switches arranged between the redundant bus connecting means and the respective bus lines of the global data bus; and a plurality of third switches arranged between the redundant bus connecting means and predetermined one of the bus lines in the global data bus.

3. The multi-port memory device of claim 2, wherein the controlling means includes:

fusing means for generating a column redundancy information signal for the corresponding bank;

a test logic having a logic for enabling test without cutting the fuse in the fusing means, for generating a redundancy test mode flag signal;

a switching control logic for generating a first and a second redundancy test mode flag pulses containing information about a period during which the corresponding bank substantially operates in normal mode and test mode in response to the redundancy test mode flag signal and a column command data driving signal, the second redundancy test mode flag pulse controlling the third switches; and a plurality of selecting logics for selecting one of the first and the second switches in the normal mode in response to the column redundancy information signal and the first redundancy test mode flag pulse.

4. The multi-port memory device of claim 3, wherein the switch control logic includes:

bank operation period signal generating means for generating a bank operation period signal that is activated during a period in which the corresponding bank substantially operates in response to a write data driving pulse for the corresponding bank and a read data driving pulse for the corresponding bank;

first redundancy test mode flag pulse generating means for generating the first redundancy test mode flag pulse that defines the period in which the corresponding bank substantially operates in the normal mode in response to the redundancy test mode flag signal and the bank operation period signal; and second redundancy test mode flag pulse generating means for generating the second redundancy test mode flag pulse that defines the period in which the corresponding bank substantially operates in the test mode in response to the redundancy test mode flag signal and the bank operation period signal.

5. The multi-port memory device of claim 3, wherein the switch control logic includes:

bank operation period signal generating means for generating a bank operation period signal that is activated during a period in which the corresponding bank substantially operates in response to write data driving pulses for some other banks that share the global data bus with the corresponding bank and read data driving pulses for some other banks that share the global data bus with the corresponding bank;

first redundancy test mode flag pulse generating means for generating the first redundancy test mode flag pulse that defines the period in which the corresponding bank substantially operates in the normal mode in response to the redundancy test mode flag signal and the bank operation period signal; and second redundancy test mode flag pulse generating means for generating the second redundancy test mode flag pulse that defines the period in which the corresponding bank substantially operates in the test mode in response to the redundancy test mode flag signal and the bank operation period signal.

6. The multi-port memory device of claim 4, wherein the bank operation period signal generating means includes:

a delay option for delaying a write data driving pulse for the corresponding bank by a time period corresponding to the delay time of the global data bus; and a NAND gate receiving a read data driving pulse for the corresponding bank and the delayed write data driving pulse for the corresponding bank from the delay option for outputting the bank operation period signal.

7. The multi-port memory device of claim 5, wherein the bank operation period signal generating means includes:

a first NAND gate receiving the write data driving pulse for the some other bank;

a delay option for delaying the output signal of the first NAND gate by a time period corresponding to the delay time of the global data bus;

a second NAND gate receiving the read data driving pulse for the some other bank; and a NOR gate receiving the output signal of the second NAND gate and the output signal of the delay option for outputting the bank operation period signal.

8. The multi-port memory device of claim 7, wherein the delay option has:

a number of inverters;

a multiplicity capacitor coupled to the nodes between the inverters; and a plurality of switches for selectively connecting the respective capacitors to the nodes.

* * * * *